United States Patent [19]

Brillson

[11] Patent Number: 5,138,416
[45] Date of Patent: Aug. 11, 1992

[54] MULTI-COLOR PHOTOSENSITIVE ELEMENT WITH HETEROJUNCTIONS

[75] Inventor: Leonard J. Brillson, Pittsford, N.Y.
[73] Assignee: Xerox Corporation, Stamford, Conn.
[21] Appl. No.: 729,081
[22] Filed: Jul. 12, 1991
[51] Int. Cl.[5] ............................................. H01L 27/14
[52] U.S. Cl. ........................................ 357/30; 357/32; 357/16; 357/31; 250/578.1; 250/226; 358/43; 358/50; 358/48
[58] Field of Search ................ 357/30 H, 30 P, 30 G, 357/30 E, 30 B, 31, 32, 24 LR, 16; 250/578, 226; 358/43, 50, 48

[56] References Cited

U.S. PATENT DOCUMENTS

| | | | |
|---|---|---|---|
| 4,117,510 | 9/1978 | Ohta | 358/44 |
| 4,213,138 | 7/1980 | Campbell et al. | 357/30 |
| 4,264,915 | 4/1981 | Bierhenke | 357/24 |
| 4,301,463 | 11/1981 | Burrus, Jr. et al. | 357/30 |
| 4,383,269 | 5/1983 | Capasso | 357/30 E |
| 4,496,981 | 1/1985 | Ota | 358/213 |
| 4,500,915 | 2/1985 | Koike | 358/44 |
| 4,604,527 | 8/1986 | Chenevas-Paule | 250/578 |
| 4,613,895 | 9/1986 | Burkey | 358/41 |
| 4,626,675 | 12/1986 | Gündner et al. | 357/30 E X |
| 4,644,402 | 2/1987 | Yamada | 358/213 |
| 4,656,503 | 4/1987 | Hynecek | 358/44 |
| 4,663,535 | 5/1987 | Nakai | 250/578 |
| 4,695,859 | 9/1987 | Guha | 357/19 |
| 4,696,533 | 9/1987 | Kingston | 350/96.14 |
| 4,709,259 | 11/1987 | Suzuki | 358/48 |
| 4,814,836 | 3/1989 | Thompson | 357/22 |
| 4,814,847 | 3/1989 | Tabatabaie | 357/30 |
| 4,840,446 | 6/1989 | Nakamura | 350/96.13 |
| 4,847,489 | 7/1989 | Dietrich | 250/226 |
| 4,860,066 | 8/1989 | Kirchner | 357/16 |
| 4,873,555 | 10/1989 | Coon | 357/4 |
| 4,975,567 | 12/1990 | Bishop et al. | 357/4 X |
| 4,984,032 | 1/1991 | Miura | 357/16 |

FOREIGN PATENT DOCUMENTS 0233982  2/1990  Japan .................................. 357/30 E

OTHER PUBLICATIONS

Campbell et al., "Improved Two Wavelength Demultiplexing InGaAsP Photodetector," Conference: Integrated and Guided-Wave Optics Technical Digest, Incline Village, NV, USA (28-30 Jan. 1980) pp. WD3-1 to WD3-3.
Woodall et al., "Differential Phototransducer", *IBM Technical Disclosure Bulletin*, vol. 12, No. 9, Feb. 1970, p. 1486.
Scifres et al., "Wavelength Demultiplexing Detector," *Xerox Disclosure Journal*, vol. 11, No. 3, May/Jun. 1986, pp. 141-143.

Primary Examiner—William Mintel
Attorney, Agent, or Firm—L. M. Yamonaco; R. Hutter

[57] ABSTRACT

A multilayer color photosensitive element made from group III-V alloy semiconductors. Charge is collected from the photosensitive element according to an amount of time it takes for red, green and blue light to travel through the layers. No filters or extra memory or patterning of the layered semiconductor during growth is required to create full color separations on a pixel by pixel basis.

11 Claims, 5 Drawing Sheets

MULTI-COLOR PHOTOSENSITIVE ELEMENT WITH HETEROJUNCTIONS

BACKGROUND OF THE INVENTION

The invention relates to color photosensitive elements, and more particularly to color photosensitive elements which function on the principle of position/transit time vs. color to obtain color separations.

Monochrome image sensor arrays typically comprise an array of photosensitive elements which scan an image bearing document and convert the microscopic image area viewed by each photosensitive element to image signal charges or pixels. To implement a full color array for the above application requires the use of more elaborate sensor arrays. Typically, two implementations have been used for full color sensing. One implementation is to use a monochrome sensor array as described above and place color filters, for instance red, green, blue for full color, on the photosensitive elements in an alternating manner. The three photosensitive elements would represent one color pixel. Even though full color images are produced, the resolution of the scan has been decreased by one third and further, each resulting pixel contains information for only one color instead of all three colors as is desirable. A second implementation involves the use of three linear arrays, each array having a color filter, and positioning the three arrays in parallel, one disposed above the other. The resolution is preserved but as the sensor arrays scan the page, memory would be required to delay the color information from two of the arrays to provide full color information for any one pixel. Memory requirements of this magnitude can be expensive to implement and also consume valuable space. In addition, the higher data rate required to transmit and process multicolor images at speeds of one full page per second or higher can exceed band width capabilities of conventional silicon (Si) image sensor arrays, also requiring the use of parallel input channels and logic array components.

U.S. Pat. No. 4,847,489 to Dietrich discloses a GaAs color CCD arrangement using a multilayer structure of alternating positively and negatively doped photosensitive materials. To control light sensitivity, the system uses different applied voltages to different layers of the device. U.S. Pat. No. 4,613,895 to Burkey et al. discloses a color sensor utilizing depth dependent absorption of light. The structure involves alternately doped layers of the same semiconductor using Si as the photoactive element. U.S. Pat. No. 4,695,859 to Guha et al. discloses a monochrome multilayer thin film light emitting and detecting array. The multiple layers provide a panchromatic response for the emitter of the device. U.S. Pat. No. 4,301,463 to Burrus, Jr. et al., U.S. Pat. No. 4,213,138 to Campbell et al. and Xerox Disclosure Journal, Volume 11 Number 3, dated May/June 1986 titled "Wavelength Demultiplexing Detector" disclose a three terminal demultiplexing photodiode wherein information present simultaneously at two distinct wavelengths can be developed into two currents. U.S. Pat. No. 4,696,533 to Kingston et al. discloses a spatial light modulator which uses a substrate having a buried channel CCD formed therein, wherein the amount of charge in the charge storage well associated with the electrode of the CCD is controlled by an electrically or optically addressed data signal. The modulator uses an electric field to shift the absorption of light. U.S. Pat. No. 4,496,981 to Ota discloses a color video camera system using three pixels, one each for the red, green and blue separations to provide information for one color pixel. U.S. Pat. No. 4,984,032 to Miura et al. discloses an avalanche photodiode wherein a light to be detected is injected through a substrate via an opening in the substrate electrode, while producing no carriers therein, into the light absorption layer.

U.S. Pat. No. 4,117,510 to Ohta et al., U.S. Pat. No. 4,500,915 to Koike et al., U.S. Pat. No. 4,656,503 to Hynecek, U.S. Pat. No. 4,663,535 to Nakai et al., and U.S. Pat. No. 4,709,259 to Suzuki et al. disclose transistor arrays in two dimensions along with color filters to differentiate colors. U.S. Pat. No. 4,264,915 to Bierhenke et al., U.S. Pat. No. 4,814,836 to Thompson, U.S. Pat. No. 4,814,847 to Tabatabaie, U.S. Pat. No. 4,840,446 to Nakamura et al., U.S. Pat. No. 4,860,066 to Kirchner et al., U.S. Pat. No. 4,873,555 to Coon et al. U.S. Pat. No. 4,604,527 to Chenevas-Paule et al. and U.S. Pat. No. 4,644,402 to Yamada disclose group III-V compound sensors which also require spatially separate photosensitive elements for different colors.

SUMMARY OF THE INVENTION

In accordance with the present invention, provided is a photosensitive element, which can be used in a raster input scanner, which can operate in a Gigahertz frequency band width, and whose electrical output can be differentiated with respect to the wavelength of light. Therefore, the photosensitive element will provide full color information on a pixel by pixel basis without the use of filters or additional memory.

DETAILED DESCRIPTION OF THE INVENTION

Figure 1:
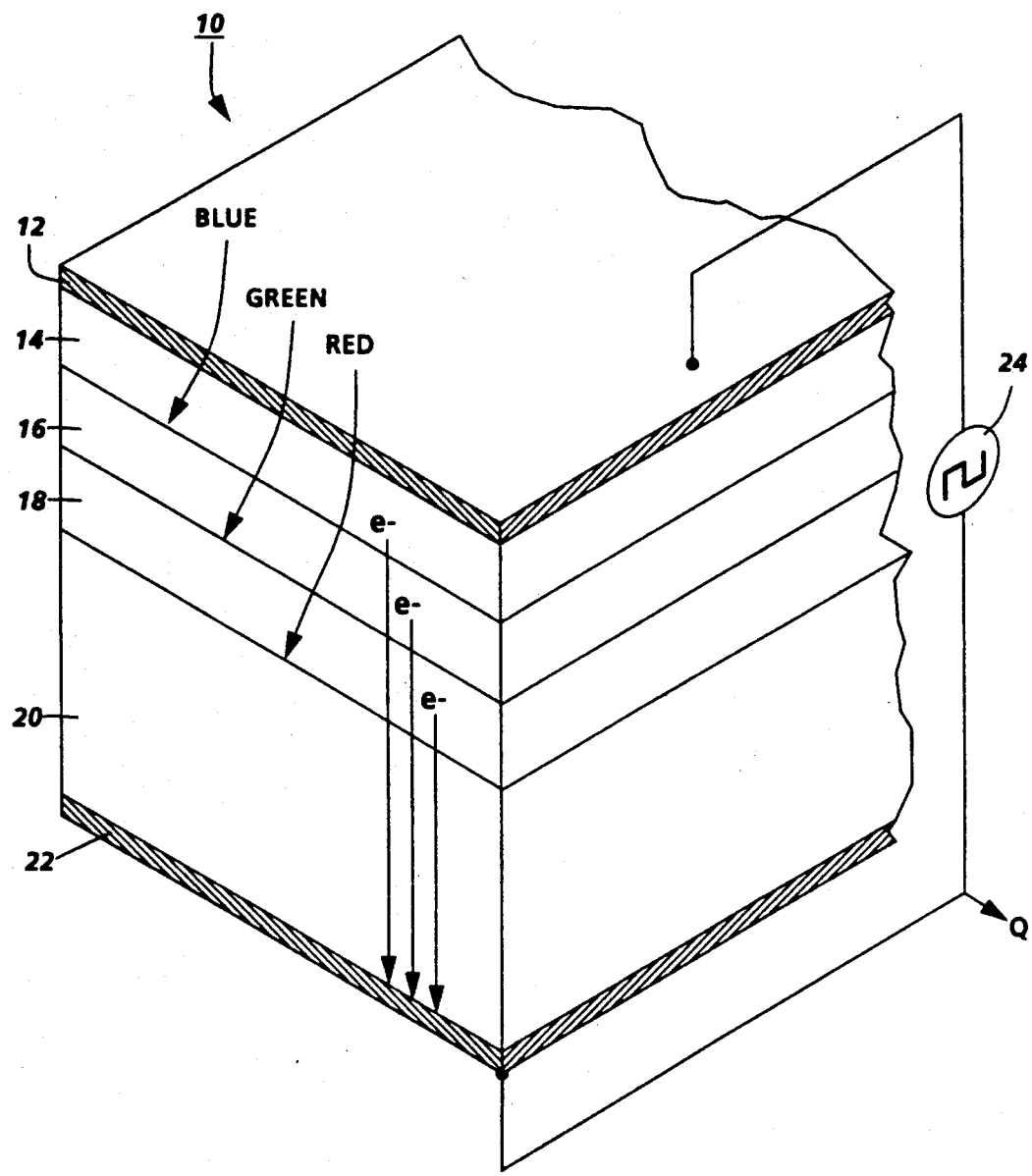
FIG. 1 is a cross sectional view of a multiple composition photosensitive element of the present invention.

Referring to FIG. 1, shown is cross sectional view of a multiple composition/band gap photosensitive element 10 consisting of three epitaxially-grown film layers 14, 16, 18, each approximately a fraction of a micron thick or equivalent thicknesses sufficient to absorb most light at a desired wavelength or band of wavelengths by virtue of their corresponding wavelength-dependent and composition-dependent absorption coefficients. Layers 14, 16, 18 are to be made of a group III-V compound semiconductor alloy such as $Al_xIn_{1-x}P$, $Ga_xIn_{1-x}P$, and $(Al_xGa_{1-x})_yIn_{1-y}P$, whose direct band gaps extend from the infrared across the visible wavelength spectrum with different alloy concentration. The band gap energies of the films decrease from outer surface to substrate. In order to separate the incident light into three complementary colors, the band gap compositions must be lattice matched accordingly as described below.

The CIE standard color matching functions, which is chosen for its ease of use, are peaked at 445 nm (2.78 eV), 555 nm (2.23 eV) and 600 nm (2.07 eV). Thus $Al_{0.40}In_{0.6}P$ (band gap equal to 2.23 eV) absorbs 445 nm strongly (1/e in 0.4 um, absorption coefficient = $2.5 \times 10^4$), passes 555 nm and passes 600 nm. The latter pair can be separated by smaller band gap alloys, for example, $Al_{0.32}In_{0.68}P$ (band gap equal to 2.07 eV), and $Al_{0.2}In_{0.8}P$ (band gap equal to 1.8 eV). If more or less green radiation (490-570 nm) absorption is desired, the thickness of the wide gap layer is adjusted accordingly. Similar adjustments to the 555/600 nm demarcation via thickness should be made to adjust color balance via growth conditions (i.e.: the thickness of the layer). This adjustment is possible because the absorption coefficient of light increases with energy above the band gap energy. For example, the penetration depth of light in GaAs decreases by a factor of 4 with only a 50% increase in energy above the band edge. The primary restriction in layer thickness and composition variation involves only the lattice matching desired to minimize dislocations and other growth defects. Such lattice matching can be achieved for the semiconductor materials described in conjunction with common semiconductor substrates such as InP and GaAs.

In the disclosed embodiment, Layer 12 is to be made of a transparent or semitransparent, laterally conductive film such as Indium Tin Oxide (which may also incorporate an antireflection coating to better couple the light into the absorbing layers) which is electrically blocking to the underlying layer 14, acting as a cover electrode for photosensitive element 10. Layer 14 is to be made of $Al_xIn_{1-x}P$ (x=0.4) or $Ga_xIn_{1-x}P$ (x=0.72) or $(Al_xGa_{1-x})_yIn_{1-y}P$ (x=0.54, y=0.51) and is near lattice matched to layer 16. Layer 14 has the characteristics to allow absorption of blue light waves while transmitting green and red light. Layer 16 is to be made of $Al_xIn_{1-x}P$ (x=0.32) or $Ga_xIn_{1-x}P$ (x=0.64) or $(Al_xGa_{1-x})_yIn_{1-y}P$ (x=0.25, y=0.51) and is near lattice matched to both layer 14 and layer 18. Layer 16 should have the characteristics to allow absorption of blue and green light while transmitting red. Layer 18 is made of $Al_xIn_{1-x}P$ (x=0.2) or $Ga_xIn_{1-x}P$ (x=0.49) or $(Al_xGa_{1-x})_yIn_{1-y}P$ (x=0.0, y=0.51) and absorbs blue, green and red light. Parameters determining whether a layer is near lattice will become apparent later in this disclosure.

Layer 20 is to be made up of single crystal undoped ($n^-$) InP or GaAs or other commercially available group III-V compound semiconductors, required for mechanical support and as an epitaxial template. Layer 22 is to be a doped ($n^{++}$), single crystal InP or GaAs with an ohmic contact such as In, In-Ga, or other contact metallurgies known to produce ohmic contacts (no charge blocking) to n-type InP or GaAs. Similarly, contacts can be made to p-type InP or GaAs using alternative metallizations to p-type ($p^{++}$) InP or GaAs. Signal generator 24 is to be connected across photosensitive element 10 to apply charge enabling transfer of charge obtained by photosensitive element 10 during exposure to light. As will be understood, although GaAs and InP has been disclosed, other group III-V compounds such as GaInP, GaPAs, and AlGaInP having similar properties can be envisioned.

In one embodiment, layer 12 is to be a semitransparent, laterally conductive film such as Indium Tin Oxide (which may also incorporate an antireflection coating to better couple the light into the absorbing layers) which is electrically blocking to the underlying layer 14. Layer 14 is to be $Al_xIn_{1-x}P$ (x=0.4); layer 16 is to be $Al_xIn_{1-x}P$ (x=0.32); layer 18 is to be $Al_xIn_{1-x}P$ (x=0.2); layer 20 is to be single crystal undoped ($n^-$) InP required for mechanical support and as an epitaxial template; and layer 22 is to be doped ($n^{++}$), single crystal InP with an ohmic contact.

In a second embodiment, layer 12 is to be a semitransparent, laterally conductive film such as Indium Tin Oxide which is electrically blocking to the underlying layer 14. Layer 14 is to be $Ga_xIn_{1-x}P$ (x=0.72); layer 16 is $Ga_xIn_{1-x}P$ (x=0.64); layer 18 is to be $Ga_xIn_{1-x}P$ (x=0.49); layer 20 is to be single crystal undoped ($n^-$) InP required for mechanical support and as an epitaxial template; and layer 22 is to be doped ($n^{++}$), single crystal InP with an ohmic contact.

In a third embodiment, layer 12 is to be a semitransparent, laterally conductive film such as Indium Tin Oxide which is electrically blocking to the underlying layer 14. Layer 14 is to be $(Al_xGa_{1-x})_yIn_{1-y}P$ (x=0.54, y=0.51); layer 16 is to be $(Al_xGa_{1-x})_yIn_{1-y}P$ (x=0.25, y=0.51); layer 18 is to be $(Al_xGa_{1-x})_yIn_{1-y}P$ (x=0.0, y=0.51); layer 20 is to be single crystal undoped ($n^-$) GaAs required for mechanical support and as an epitaxial template; and layer 22 is doped ($n^{++}$), single crystal InP with an ohmic contact.

The lattice match between these epitaxial materials presents no apparent problems. For InP, a=5.87 Å, whereas InAlP has a lattice constant $a_0$=5.71 Å, 5.75 Å, and 579 Å for the 2.23 eV, 2.07 eV, and 1.80 eV alloy compositions respectively. Between layers 14 and 16, this is a lattice mismatch of only 0.7%, between layers 16 and 18, only 0.7%, and between layers 18 and 20, only 1.2%, sufficiently close to grow several tenths of a micron or more with little or no dislocation formation due to strain. Lattice mismatches described above are considered acceptable as near lattice matches.

As described, other compounds which satisfy both the optical and materials constraints described for $Al_xIn_{1-x}P$ on InP include but are not necessarily limited to $Ga_xIn_{1-x}P$ on GaAs and $(Al_xGa_{1-x})_yIn_{1-y}P$ on GaAs. For $Ga_xIn_{1-x}P$ on GaAs, where layer 14 has x=0.72 (band gap equal to 2.23 eV, $a_0$=5.58 Å), layer 16 has x=0.64 (band gap equal to 2.05 eV, $a_0$=5.6 Å), and layer 18 has x=0.49 (band gap equal to 1.88 eV, $a_0$=5.65 Å). Between layers 14 and 16, this is a lattice mismatch of only 0.36%, between layers 16 and 18, only 0.9%, and between layers 18 and 20 (GaAs), 0.0%. Similarly, for $(Al_xGa_{1-x})_yIn_{1-y}P$ on GaAs, where layer 14 has x=0.54, y=0.51 (band gap equal to 2.25 eV, $a_0$=5.65 Å), layer 16 has x=0.25, y=0.51 (band gap equal to 2.05 eV, $a_0$=5.65 Å), and layer 18 has x=0.0, y=0.51 (band gap equal to 1.9 eV, $a_0$=5.65 Å). For this combination of materials there is no lattice mismatch at all between layers 14, 16, 18, and 20 (GaAs). Furthermore, compositions can be varied by 25% or more in order to further optimize optical or materials growth properties.

As shown in FIG. 1, during operation light having blue, green and red components is to be applied to photosensitive element 10. During exposure, the red component of the light will create a red charge packet and then will be transmitted through layers 14 and 16 and absorbed by layer 18 causing carriers to travel to layer 22. The green component of the light will create a green charge packet and which will be transmitted through layer 14 and absorbed by layer 16 causing carriers to travel from layer 16 and layer 18 to layer 22. Further, the blue component of the light will create a blue charge packet and will be absorbed by layer 14 causing the carriers from layer 14, layer 16 and layer 18 to travel to layer 22.

Figure 2A:
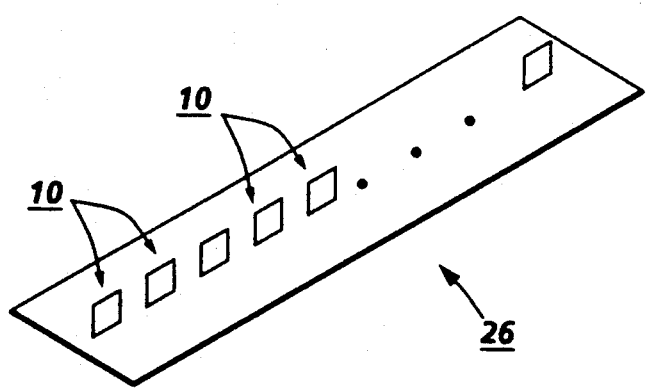
FIG. 2A and 2B is a schematic view of a full width photosensitive element array bar and a full page photosensitive element array utilizing a plurality of photosensitive elements of FIG. 1.
Figure 2B:
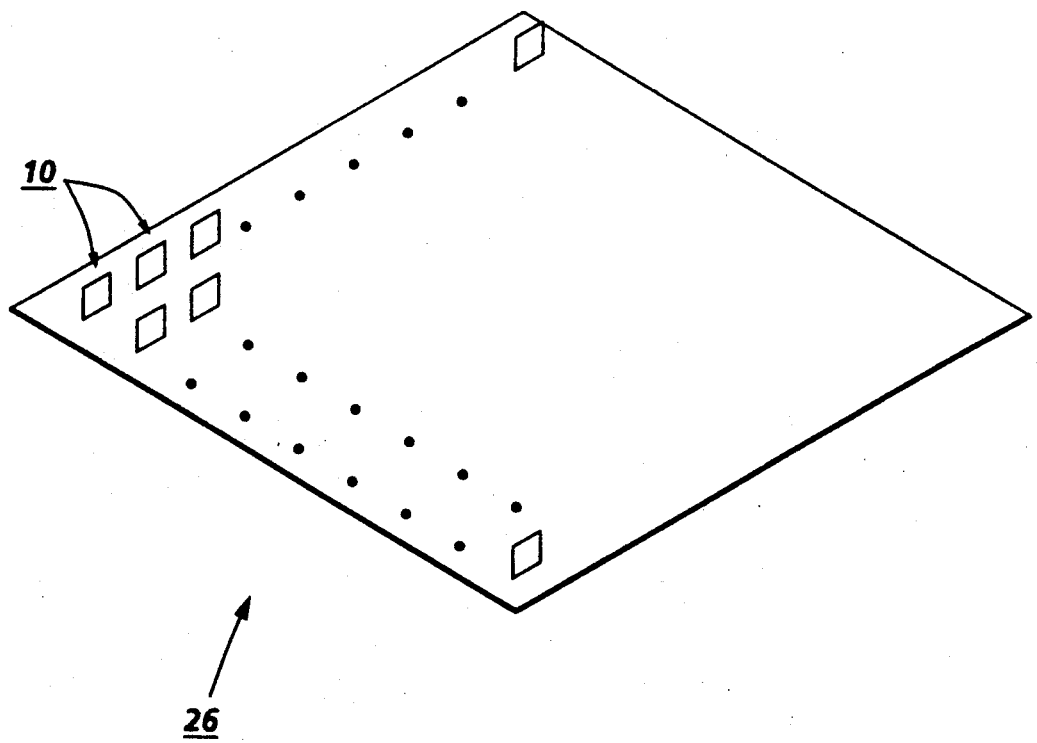

As shown in FIGS. 2A and 2B, photosensitive elements 10 can be assembled into a several inch wide butted one dimensional array 28 or butted together in two dimensions to form a full page array 26 of photosensitive elements or grown on large (wafer) areas and simply patterned by the layer 12 and/or layer 22 geometry. Each photosensitive element 10, represents a full color pixel of an area being imaged. Using an arrangement of photosensitive element 10 of this invention, as in arrays 26 or 28, a raster input scanner can be designed which can operate at GigaHertz frequencies which uses no filter to separate the light into its basic components. Although butting is disclosed, it can be appreciated that other methods of arranging photosensitive elements to form arrays can be envisioned.

Figure 3:
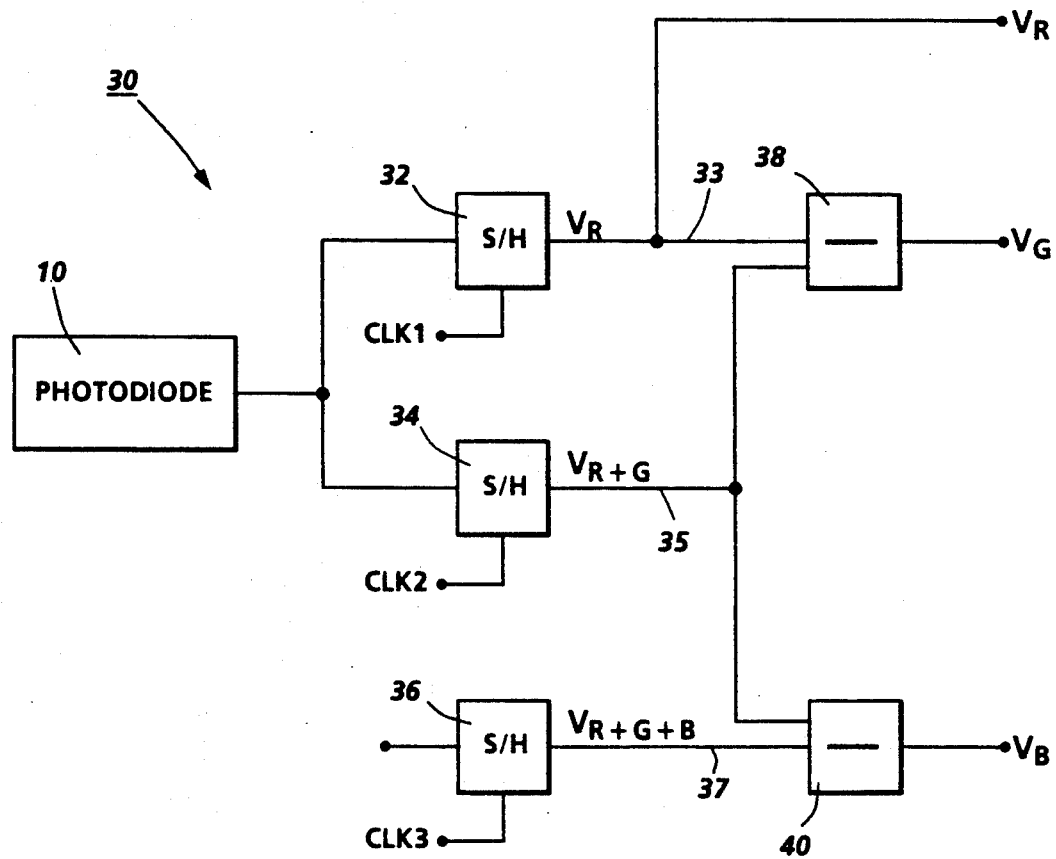
FIG. 3 is a block diagram of the system used to capture and use the charge created by the photosensitive element of FIG. 1.
Figure 4:
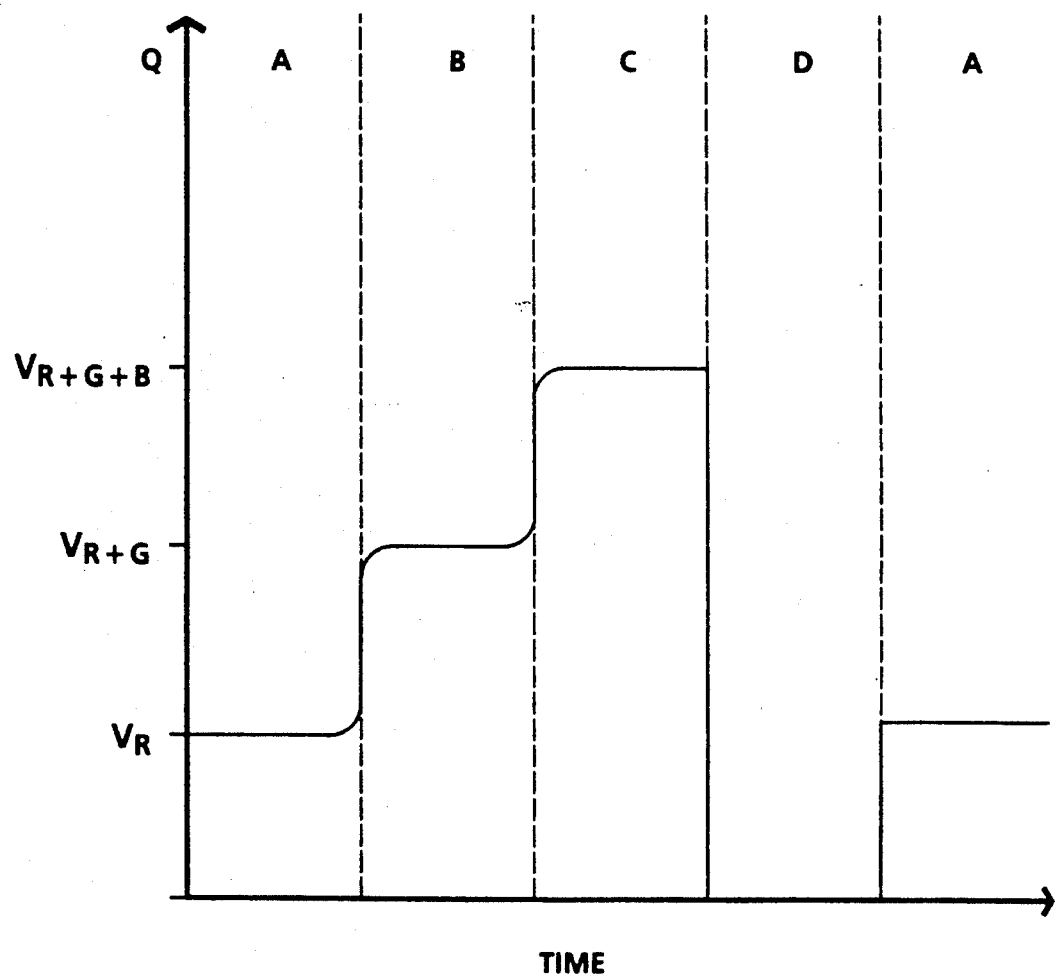
FIG. 4 is a waveform depicting the behavior of charge as the photosensitive element of FIG. 1 is exposed to light.
Figure 5:
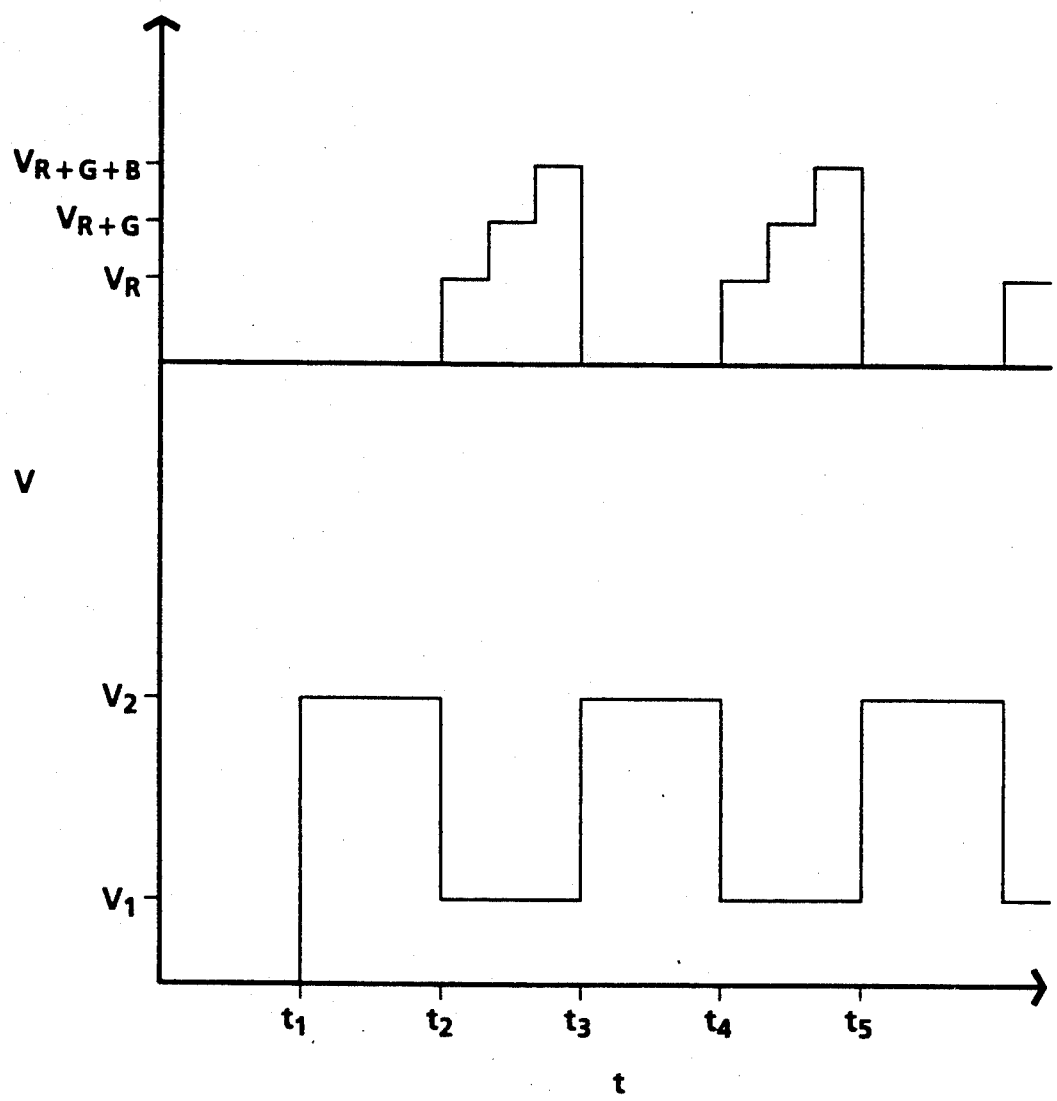
FIG. 5 is a timing diagram depicting consecutive charge transfers from the photosensitive element of FIG. 1.

Referring also to FIGS. 3-5, at time $t_1$ to $t_2$, a reset pulse of voltage V2 is to be applied to photosensitive element 10 from signal generator 24 causing charge to be swept from photosensitive element 10 or reset. As can be appreciated, the absorption of incoming light at different positions within layers 14, 16, 18 leads to differences in transit time for the photoexcited carriers or charge packets to sweep across those layers. The resultant waveform will show temporal features which depend on the colors of illumination. For electrons moving under a field away from layer 12, the transit time will decrease with increasing wavelength. So, for example, carriers, or charge packets, produced by blue light take longer to reach layer 22 than carriers produced by red light which reach layer 22 first. At time $t_2$ to $t_3$, as voltage V1 is applied to photosensitive element 10, charge will be collected relating to the red component of light followed by a combination of red and blue and finally a combination of red, blue and green. At time $t_3$ to $t_4$, charge will again be swept from photosensitive element 10 and so on.

As best seen in FIG. 4, segment A represents the charge which will be collected as a result of the red component of light at a voltage $V_R$. Segment B and C represent the charge which will be collected for red plus green and red plus green plus blue components of light as voltages $V_{R+G}$ and $V_{R+G+B}$ respectively. Segment D shows charge being swept from photosensitive element 10 resulting in photosensitive element 10 being reset.

Referring particularly to FIGS. 3 and 4, at a time represented by segment A, charge on photosensitive element 10 will be captured by sample and hold circuit 32 yielding a signal 33 at a voltage $V_R$ representative of the red component of the light. In a like manner, at a time represented by segment B, charge on photosensitive element 10 will be captured by sample and hold circuit 34 yielding a signal 35 representative of the red plus green components of the light at a voltage $V_{R+G}$. And finally, at a time represented by segment C, charge on photosensitive element 10 will be captured by sample and hold circuit 36 yielding a signal 37 representative of the red plus green plus blue components of the light at a voltage $V_{R+G+B}$.

In order for the information from photosensitive element 10 to be used in a full color scanner application, voltages for individual color separations of red, green and blue must be derived. Subtraction circuit 38 will subtract signal 33 from signal 35 yielding a green separation voltage or $V_{R+G} - V_R = V_G$. In a similar manner, subtraction circuit 40 will subtract signal 35 from signal 37 yielding a blue separation or $V_{R+G+B} - V_{R+G} = V_B$. With the light now separated into its three components, $V_R$, $V_G$, $V_B$, the signal can be routed to other circuits in a system for image processing or the like.

Other methods of generating complementary color information from the color selective layers are available using digital techniques. For example, deconvolution of the three signals may be performed digitally, based on only segments of the charge stream during a given period of time. Digital techniques may also be used to shift the balance of the various separated components for display, printing, or further image processing.

While a photosensitive element having three layers has been described, photodetectors having other than three layers can be envisioned having layered structures which function on the principle of position/transit time vs. color. The simplest such structure would be a one-layer device which differentiates color because of the different absorption depths for different incident wavelengths. Thus, blue light absorption occurs close to the outer surface, green light absorption extends further into the layer, and red light absorption can extend throughout an appropriately chosen film thickness and composition. The resultant differences in the shape of the resulting signal pulses would provide a means to identify different wavelengths or wavelength ranges. A two-layer structure allows absorption of blue or blue-green light in the outer layer and green or yellow-green in the inner layer. Light passing through both would be absorbed by the substrate and represents the red light component. Beyond the three layer structure described herein, one could use larger numbers of layers to obtain finer resolution of the incident light spectrum. In principle, a gradient of absorption energies due to a continuous variation of semiconductor composition could provide such spectral resolution, but the distinctions between wavelengths become correspondingly more difficult to identify. While the invention is described in the context of the three primary colors, the invention is not limited to those colors or color combination. Other colors and color combinations may instead be envisioned.

Another alternative embodiment would involve elimination of layer 18, with red light absorbed in the substrate n− InP or GaAs. The thickness of layer 18 can be adjusted to shorten or lengthen the time elapsed between illumination and the transit of the red charge element to layer 22. Shortening this transit time would improve the cycle time of the device. Lengthening this transit time would improve the signal to noise performance of the sample and hold circuitry to the incoming pulse (relative to its baseline).

While the invention has been described with reference to the structures disclosed, it is not confined to the details set forth, but is intended to cover such modifications or changes as may come within the scope of the following claims:

I claim:

1. A multilayer photosensitive element, comprising:

a first cover electrode layer made of at least a semitransparent laterally conductive film;

a second layer adjacent to said first layer, said second layer being made of a material selected from a group III-V compound semiconductor alloy, said second layer having a first photo property of absorbing a first wavelength of light, transmitting at least a second wavelength of light therethrough;

a third support layer adjacent to said second layer, said third layer being made of a single crystal undoped (n−) group III-V semiconductor alloy;

a fourth layer adjacent to said third layer, said fourth layer being made of a material selected from a doped (n++) single crystal group III-V semiconductor alloy with contact metallurgies forming a metallic ohmic contact used to collect charge from said third layer; and a fifth layer, disposed between said second layer and said third layer, said fifth layer being made of a material selected from a group III-V compound semiconductor alloy, said fifth layer having a second photo property of absorbing said first wavelength of light, absorbing said second wavelength of light, and transmitting at least a third wavelength of light therethrough, said fifth layer being near lattice matched to said second layer.

2. A multilayer photosensitive element according to claim 1, further comprising:

a sixth layer, disposed between said fifth layer and said third layer, said sixth layer being made of a material selected from a group III-V compound semiconductor alloy, said sixth layer having a third photo property of absorbing said first wavelength of light, absorbing said second wavelength of light, and absorbing a third wavelength of light, said sixth layer being near lattice matched to said fifth layer.

3. A multilayer photosensitive element according to claim 2 wherein said second layer, said fifth layer and said sixth layer are each less than 1 micron thick and are sufficiently thick to absorb light at the respective desired wavelength thereof.

4. A multilayer photosensitive element, comprising:

a first layer made of at least a semitransparent laterally conductive film acting as a cover electrode;

a second layer adjacent to said first layer, said second layer being made of a material selected from a group III-V compound semiconductor alloy, said second layer having a first photo property of absorbing blue light, transmitting green light, and transmitting red light therethrough;

a third layer adjacent to said second layer, said third layer being made of a material selected from a group III-V compound semiconductor alloy, said third layer having a second photo property of absorbing blue light, absorbing green light and transmitting red light therethrough, and said third layer being near lattice matched to said second layer;

a fourth layer adjacent to said third layer, said fourth layer being made of a material selected from a group III-V compound semiconductor alloy, said fourth layer having a third photo property of absorbing blue light, absorbing green light and absorbing red light, and said fourth layer being near lattice matched to said third layer;

a fifth layer adjacent to said fourth layer, said fifth layer being made of a material selected from a single crystal undoped (n−) group III-V semiconductor alloy required for mechanical support as an epitaxial template; and a sixth layer adjacent to said fifth layer, said sixth layer being, made of a material selected from a doped (n++) single crystal group III-V semiconductor alloy with contact metallurgies forming a metallic ohmic contact used to collect charge from said fifth layer.

5. A multilayer photosensitive element according to claim 4 wherein said second layer, said third layer, and said fourth layer are each less than 1 micron thick and are sufficiently thick to absorb light at the respective desired wavelength thereof.

6. A multilayer photosensitive element according to claim 5 wherein said first layer is made of Indium Tin Oxide;

said second layer is made of $AI_xIn_{1-x}P(x=0.4)$;

said third layer is made of $AI_xIn_{1-x}P(x=0.32)$;

said fourth layer is made of $AI_xIn_{1-x}P(x=0.2)$;

said fifth layer is made of single crystal undoped (n−) InP; and said sixth layer is made of doped (n++), single crystal InP with an ohmic contact.

7. A multilayer photosensitive element according to claim 5 wherein said first layer is made of Indium Tin Oxide;

said second layer is made of $Ga_xIn_{1-x}P(x=0.72)$;

said third layer is made of $Ga_xIn_{1-x}P(x=0.64)$;

said fourth layer is made of $Ga_xIn_{1-x}P(x=0.49)$;

said fifth layer is made of single crystal undoped (n−) InP; and said sixth layer is made of doped (n++), single crystal InP with an ohmic contact.

8. A multilayer photosensitive element according to claim 5 wherein said first layer is made of Indium Tin Oxide;

said second layer is made of $(AI_xGa_{1-x})_yIn_{1-y}P(x=0.54, y=0.51)$;

said third layer is made of $(AI_xGa_{1-x})_yIn_{1-y}P(x=0.25, y=0.51)$;

said fourth layer is made of $(AI_xGa_{1-x})_yIn_{1-y}P(x=0.0, y=0.51)$;

said fifth layer is made of single crystal undoped (n−) GaAs; and said sixth layer is made of doped (n++), single crystal GaAs with an ohmic contact.

9. A method for collecting charge resulting from light exposure on a photosensitive element to produce a first charge packet, and a second charge packet, said photosensitive element having a plurality of layers, one of said plurality of layers being a collection layer for collecting said charge, said first charge packet arriving at said collecting layer first in time, said second charge packet arriving at said collection layer after said first charge packet, including the steps of:

a) applying a voltage $V_2$ to clear said charge from said photosensitive element;

b) applying a voltage $V_1$ allowing said charge to collect on said collection layer of said photosensitive element;

c) collecting said first charge packet from said collection layer to produce a first signal;

d) collecting said first charge packet and said second charge packet from said collection layer to produce a second signal; and e) comparing said first signal with said second signal.

10. A method for collecting charge according to claim 9 further producing a third charge packet, said third charge packet arriving at said collection layer after said second charge packet, further including the steps of:

f) collecting said first charge packet, said second charge packet and said third charge packet from said collection layer to produce a third signal; and g) comparing said second signal with said third signal.

11. A method for collecting charge resulting from light exposure on a photosensitive element to produce a red charge packet, a blue charge packet and a green charge packet, said photosensitive element having a plurality of layers, one of said plurality of layers being a collection layer for collecting said charge, said red charge packet arriving at said collecting layer first in time, said green charge packet arriving at said collection layer after said red charge packet and said blue charge packet arriving at said collection layer after said green charge packet, including the steps of:

a) applying a voltage $V_2$ to clear said charge from said photosensitive element;

b) applying a voltage $V_1$ allowing said charge to collect on said collection layer of said photosensitive element;

c) collecting said red charge packet from said collection layer to produce a first signal;

d) collecting said red charge packet and said green charge packet from said collection layer to produce a second signal;

e) collecting said red charge packet, said green charge packet and said blue charge packet from said collection layer to produce a third signal;

f) comparing said first signal with said second signal; and g) comparing said second signal with said third signal.

* * * * *